United States Patent
Odnoblyudov et al.

(10) Patent No.: US 9,159,896 B2
(45) Date of Patent: Oct. 13, 2015

(54) VERTICAL SOLID-STATE TRANSDUCERS AND HIGH VOLTAGE SOLID-STATE TRANSDUCERS HAVING BURIED CONTACTS AND ASSOCIATED SYSTEMS AND METHODS

(71) Applicant: Micron Technology, Inc., Boise, ID (US)

(72) Inventors: Vladimir Odnoblyudov, Eagle, ID (US); Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/607,839

(22) Filed: Jan. 28, 2015

(65) Prior Publication Data

US 2015/0162513 A1   Jun. 11, 2015

Related U.S. Application Data

(62) Division of application No. 13/708,526, filed on Dec. 7, 2012, now Pat. No. 8,963,121.

(51) Int. Cl.
*H01L 33/62* (2010.01)
*H01L 33/64* (2010.01)
(Continued)

(52) U.S. Cl.
CPC ............ *H01L 33/62* (2013.01); *H01L 33/0025* (2013.01); *H01L 33/06* (2013.01);
(Continued)

(58) Field of Classification Search
CPC ......... H01L 33/50; H01L 33/52; H01L 33/58; H01L 33/62; H01L 27/00
See application file for complete search history.

(56) References Cited

U.S. PATENT DOCUMENTS 7,732,825 B2   6/2010   Kim et al.
7,910,395 B2   3/2011   Shei et al.
(Continued)

FOREIGN PATENT DOCUMENTS

KR   20080037310   4/2008
KR    101093117   12/2011

OTHER PUBLICATIONS

"Cree, Inc., New High-Efficiency Cree XLamp® LED Can Reduce Initial Fixture Cost for Lighting Manufacturers, retreived from the Internet on Mar. 21, 2012, URL: <http://www.cree.com/press/press_detail.asp?i=12950660553>, 2 pages."
(Continued)

*Primary Examiner* — Kyoung Lee
*Assistant Examiner* — Ratisha Mehta
(74) *Attorney, Agent, or Firm* — Perkins Coie LLP

(57) ABSTRACT

Solid-state transducers ("SSTs") and vertical high voltage SSTs having buried contacts are disclosed herein. An SST die in accordance with a particular embodiment can include a transducer structure having a first semiconductor material at a first side of the transducer structure, and a second semiconductor material at a second side of the transducer structure. The SST can further include a plurality of first contacts at the first side and electrically coupled to the first semiconductor material, and a plurality of second contacts extending from the first side to the second semiconductor material and electrically coupled to the second semiconductor material. An interconnect can be formed between at least one first contact and one second contact. The interconnects can be covered with a plurality of package materials.

8 Claims, 12 Drawing Sheets

(51) Int. Cl.
*H01L 33/40* (2010.01)
*H01L 33/00* (2010.01)
*H01L 33/06* (2010.01)
*H01L 33/32* (2010.01)

(52) U.S. Cl.
CPC .............. *H01L 33/32* (2013.01); *H01L 33/405* (2013.01); *H01L 33/64* (2013.01); *H01L 2933/0016* (2013.01); *H01L 2933/0033* (2013.01); *H01L 2933/0066* (2013.01)

(56) References Cited

U.S. PATENT DOCUMENTS

| | | | | |
|---|---|---|---|---|
| 2007/0257335 | A1* | 11/2007 | O'Brien | 257/618 |
| 2007/0284598 | A1 | 12/2007 | Shakuda et al. | |
| 2008/0179602 | A1 | 7/2008 | Negley et al. | |
| 2009/0321756 | A1 | 12/2009 | Shen | |
| 2010/0059733 | A1 | 3/2010 | Shei et al. | |
| 2010/0140655 | A1* | 6/2010 | Shi | 257/99 |
| 2010/0151604 | A1 | 6/2010 | Kal et al. | |
| 2010/0320936 | A1 | 12/2010 | Yao | |
| 2011/0062482 | A1 | 3/2011 | Solomensky et al. | |
| 2011/0133654 | A1 | 6/2011 | McKenzie et al. | |
| 2011/0298002 | A1 | 12/2011 | Takeuchi et al. | |
| 2012/0153253 | A1* | 6/2012 | Kimura et al. | 257/13 |
| 2014/0159063 | A1 | 6/2014 | Odnoblyudov et al. | |

OTHER PUBLICATIONS

"International Search Report and Written Opinion issued Mar. 31, 2014 in International Application No. PCT/US2013/073055, 16 pages."
"OSRAM Opto Semiconductors, Reliability of the Dragon Product Family, Application Note, May 2011, 13 pages."
"Philips Lumileds, Case Study: Beyond Compact Flourescent Lighting, Luxeon Rebel Enables Highly-Efficient Replacement for Compact Flourescent Lamp (CFL) Downlighter, Sep. 26, 2008, 4 pages."
"Philips Lumileds, Evaluating the Lifetime Behavior of LED Systems, The Path to a Sustainable Luminare Business Model, Oct. 5, 2004, 16 pages."

* cited by examiner

VERTICAL SOLID-STATE TRANSDUCERS AND HIGH VOLTAGE SOLID-STATE TRANSDUCERS HAVING BURIED CONTACTS AND ASSOCIATED SYSTEMS AND METHODS

CROSS-REFERENCE TO RELATED APPLICATIONS

This application is a divisional of U.S. application Ser. No. 13/708,526 filed Dec. 7, 2012, which is incorporated herein by reference in its entirety.

TECHNICAL FIELD

The present technology is related to high voltage solid-state transducers and methods of manufacturing solid-state transducers and high voltage solid-state transducer dies. In particular, the present technology relates to vertical high voltage solid-state transducers having buried contacts and associated systems and methods.

BACKGROUND

Solid state lighting ("SSL") devices are designed to use light emitting diodes ("LEDs"), organic light emitting diodes ("OLEDs"), and/or polymer light emitting diodes ("PLEDs") as sources of illumination, rather than electrical filaments, plasma, or gas. Solid-state devices, such as LEDs, convert electrical energy to light by applying a bias across oppositely doped materials to generate light from an intervening active region of semiconductor material. SSL devices are incorporated into a wide variety of products and applications including common consumer electronic devices. For example, mobile phones, personal digital assistants ("PDAs"), digital cameras, MP3 players, and other portable electronic devices utilize SSL devices for backlighting. Additionally, SSL devices are also used for traffic lighting, signage, indoor lighting, outdoor lighting, and other types of general illumination.

Microelectronic device manufactures are developing more sophisticated devices in smaller sizes while requiring higher light output with better performances. To meet current design criteria, LEDs are fabricated with decreasing footprints, slimmer profiles and are subsequently serially coupled in high voltage arrays. In certain embodiments, the individual SSL dies may include more than one LED junction coupled in series.

FIG. 1A is a cross-sectional view of a conventional high voltage SSL device 10a shown with two junctions in series in a lateral configuration. As shown in FIG. 1A, the high voltage SSL device 10a includes a substrate 20 carrying a plurality of LED structures 11 (identified individually as first and second LED structures 11a, 11b) that are electrically isolated from one another by an insulating material 12. Each LED structure 11a, 11b has an active region 14, e.g., containing gallium nitride/indium gallium nitride (GaN/InGaN) multiple quantum wells ("MQWs"), positioned between P-type GaN 15 and N-type GaN 16 doped materials. The high voltage SSL device 10a also includes a first contact 17 on the P-type GaN 15 and a second contact 19 on the N-type GaN 16 in a lateral configuration. The individual SSL structures 11a, 11b are separated by a notch 22 through which a portion of the N-type GaN 16 is exposed. An interconnect 24 electrically connects the two adjacent SSL structures 11a, 11b through the notch 22. In operation, electrical power is provided to the SSL device 10 via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a growth substrate (not shown), similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15. A converter material 23 and an encapsulant 25 can then be positioned over one another on the LED structure 11. In operation, the LED structure 11 can emit a first emission (e.g., blue light) that stimulates the converter material 23 (e.g., phosphor) to emit a second emission (e.g., yellow light). The combination of the first and second emissions can generate a desired color of light (e.g., white light).

The vertical LED device 10b typically has higher efficiency than lateral LED device configurations. Higher efficiency can be the result of enhanced current spreading, light extraction and thermal properties, for example. However, despite improved thermal properties, the LED device 10b still produces a significant amount of heat that can cause delamination between various structures or regions and/or cause other damage to the packaged device. Additionally, as shown in FIG. 1B, the vertical LED device 10b requires access to both sides of the die to form electrical connections with the first and second contacts 17 and 19, and typically includes at least one wire bond coupled to the second contact 19, which can increase a device footprint and complexity of fabrication. Some of the conventional LED die processing steps have been restricted to the package level (e.g., after singulation at a die level (FIG. 1B)) to achieve high performance and prevent damage to the devices during processing steps. Such package-level processing steps increase demands on manufacturing resources such as time and costs as well as can have other undesirable results such as surface roughening of the package. Accordingly, there remains a need for vertical LEDs, vertical high voltage LED dies and other solid-state devices that facilitate packaging and have improved performance and reliability.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views.

DETAILED DESCRIPTION

Specific details of several embodiments of solid-state transducers ("SSTs") and associated systems and methods are described below. The term "SST" generally refers to solid-state devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-4C.

Figure 1A:
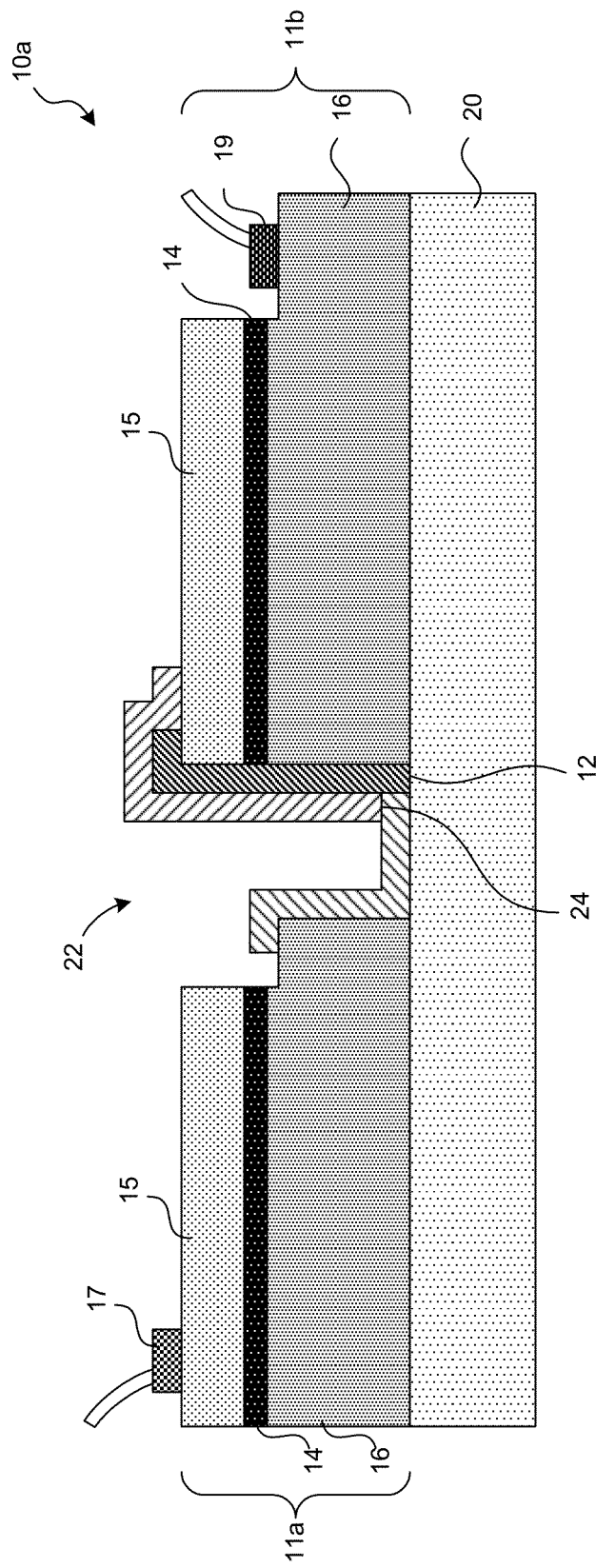
FIGS. 1A and 1B are schematic cross-sectional diagrams of LED devices configured in accordance with the prior art.
Figure 1B:
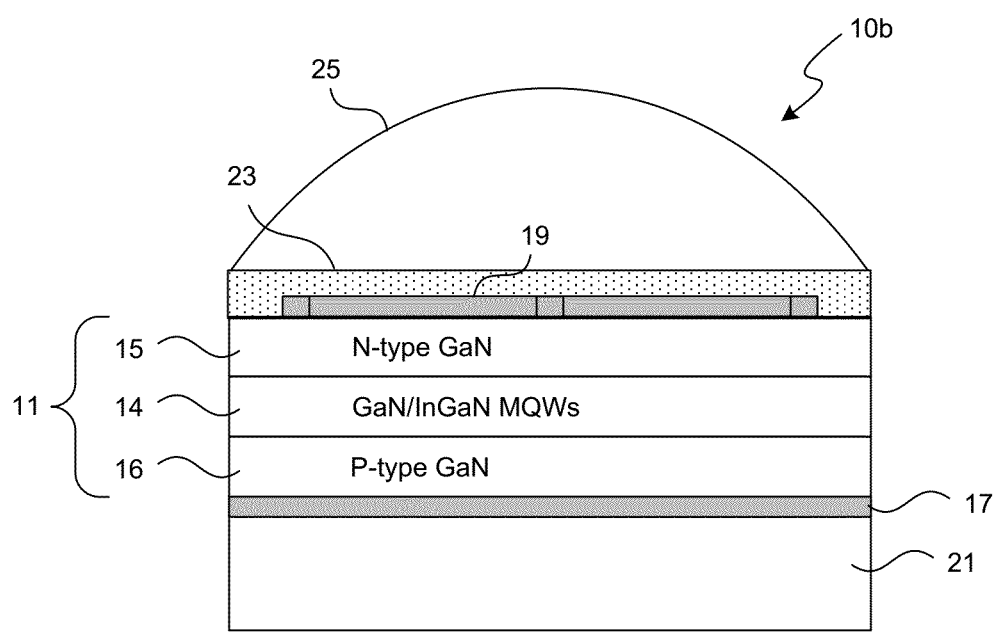
Figure 2A:
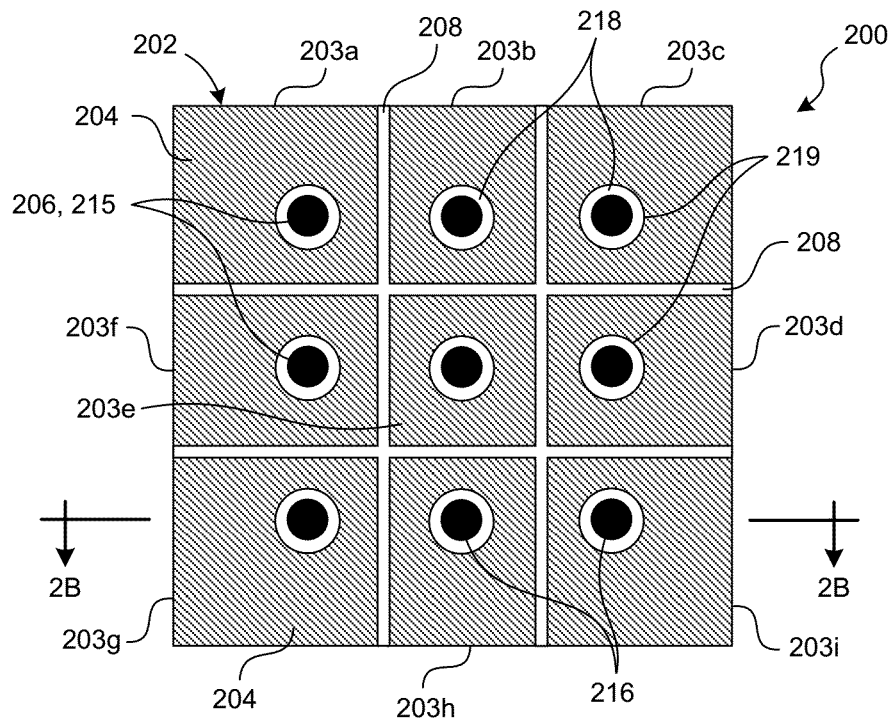
FIGS. 2A-2L are schematic plan and cross-sectional views illustrating portions of a process for forming solid-state transducers in accordance with embodiments of the present technology.

FIGS. 2A-4C are schematic plan and cross-sectional views illustrating a process for forming SSTs in accordance with an embodiment of the present technology. FIGS. 2A-2L illustrate various portions of the process showing a single SST die 200 for clarity; however, it is understood that the illustrated steps can be implemented at the wafer-level for producing a plurality of SST dies 200 concurrently using the process steps described herein. For example, FIGS. 2A and 2B illustrate an SST die 200 at a stage of the process after a transducer structure 202 has been formed on a growth substrate 220. As shown in FIG. 2B, the SST die 200 has a first side 201a and a second side 201b facing away from the first side 201a. Referring to FIGS. 2A and 2B together, the SST die 200 can include a plurality of features that separate the transducer structure 202 into a plurality of junctions 203 (identified individually as junctions 203a-203i). For example, trenches 208 that extend from the first side 201a of the SST die 200 through the transducer structure 202 to the substrate 220 can be formed to separate and electrically isolate the individual junctions 203 from adjacent or other junctions 203 on the SST die 200.

The transducer structure 202 can include a first semiconductor material 210 at the first side 201a, a second semiconductor material 212 at the second side 201b, and an active region 214 located between the first and second semiconductor materials 210, 212. In other embodiments, the transducer structure 202 can also include silicon nitride, aluminum nitride (AlN), and/or other suitable intermediate materials.

The first and second semiconductor materials 210 and 212 can be doped semiconductor materials. In one embodiment, the first semiconductor material 210 can be a P-type semiconductor material (e.g., P-GaN), and the second semiconductor material 212 can be an N-type semiconductor material (e.g., N-GaN). In other embodiments, the first and second semiconductor materials 210 and 212 may be reversed. In further embodiments, the first and second semiconductor materials 210 and 212 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), aluminum gallium nitride (AlGaN), and/or other suitable semiconductor materials.

The active region 214 between the first and second semiconductor materials 210 and 212 can include a single quantum well ("SQW"), MQWs, and/or a single grain semiconductor material (e.g., InGaN). In one embodiment, a single grain semiconductor material, such as InGaN can have a thickness greater than about 10 nanometers and up to about 500 nanometers. In certain embodiments, the active region 214 can include an InGaN SQW, GaN/InGaN MQWs, and/or an InGaN bulk material. In other embodiments, the active region 214 can include aluminum gallium indium phosphide (AlGaInP), aluminum gallium indium nitride (AlGaInN), and/or other suitable materials or configurations.

In certain embodiments, at least one of the first semiconductor material 210, the active region 214, and the second semiconductor material 212 can be formed on the growth substrate 220 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 202 may be formed using other suitable epitaxial growth techniques.

Figure 2B:
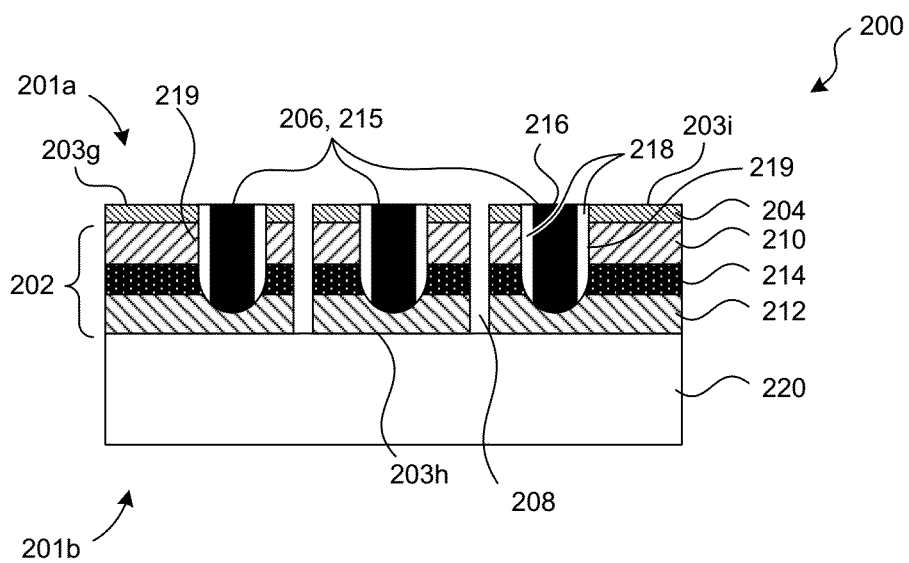

As shown in FIGS. 2A and 2B, a first contact 204 can be formed on the first semiconductor material 210. In some embodiments, the first contact 204 can extend over a large portion of the underlying first semiconductor material 210. In other embodiments, the first contact 204 can be formed over a smaller portion of the first semiconductor material 210. In certain arrangements, the first contact 204 can be a mirror and/or made from a reflective contact material, including nickel (Ni), silver (Ag), copper (Cu), aluminum (Al), tungsten (W), and/or other reflective materials. As illustrated in FIGS. 2A and 2B, the first contact 204 can be a continuous overlay of contact material formed over the first semiconductor material 210; however, in other embodiments, the SST die 200 can include separate reflective elements positioned at the first side 201a and overlaying portions of the first semiconductor material 210. During subsequent processing stages, the transducer structure 202 may be inverted such that the reflective first contact 204 can redirect emissions (e.g., light) through the active region 214 and toward the second side 201b of the SST die 200 (FIG. 2B). In other embodiments, the first contact 204 can be made from non-reflective materials and/or the SST die 200 may not include reflective elements. The first contact 204 can be formed using chemical vapor deposition ("CVD"), physical vapor deposition ("PVD"), atomic layer deposition ("ALD"), spin coating, patterning, and/or other suitable techniques known in the art.

A second contact 206 can include a plurality of buried contact elements 215 that extend from the first side 201a of the SST die 200 to or into the second semiconductor material 212. Referring to FIG. 2B, the buried contact elements 215 can be formed by etching or otherwise forming a plurality of channels or openings 219 in the transducer structure 202 that extends from the first side 201a of the transducer structure 202 (e.g., the first contact 204 or the first semiconductor material 210) to or into the second semiconductor material 212. In one embodiment, the openings 219 can be formed before the first contact 204 is formed on the first semiconductor material 210 and can extend to or into a portion of the second semiconductor material 212 (as shown in FIG. 2B). In another embodiment, the openings 219 may be formed after the first contact material 204 is formed at the first side 201a of the SST die 200. The etched sidewalls of the openings 219 can be coated with a dielectric material 218 to electrically insulate a second contact material 216 along a path extending through the first contact 204, the first semiconductor material 210, and the active region 214. The dielectric material 218 can include silicon dioxide ($SiO_2$), silicon nitride (SiN), and/or other suitable dielectric materials and can be deposited in the openings 219 via CVD, PVD, ALD, patterning, and/or other suitable techniques known in the semiconductor fabrication arts.

In a next process step, the buried contact elements 215 can be formed by disposing the second contact material 216 in the insulated openings 219 to electrically connect with exposed portions of the second semiconductor material 212 in the openings 219. The second contact material 216 can include titanium (Ti), aluminum (Al), nickel (Ni), silver (Ag), and/or other suitable conductive materials. The second contact material 216 can be deposited using CVD, PVD, ALD, patterning, and/or other known suitable techniques. Accordingly, as shown in FIGS. 2A and 2B, both the first and second contacts 204 and 206 are electrically accessible from the first side 201a of the SST die 200.

Figure 2C:
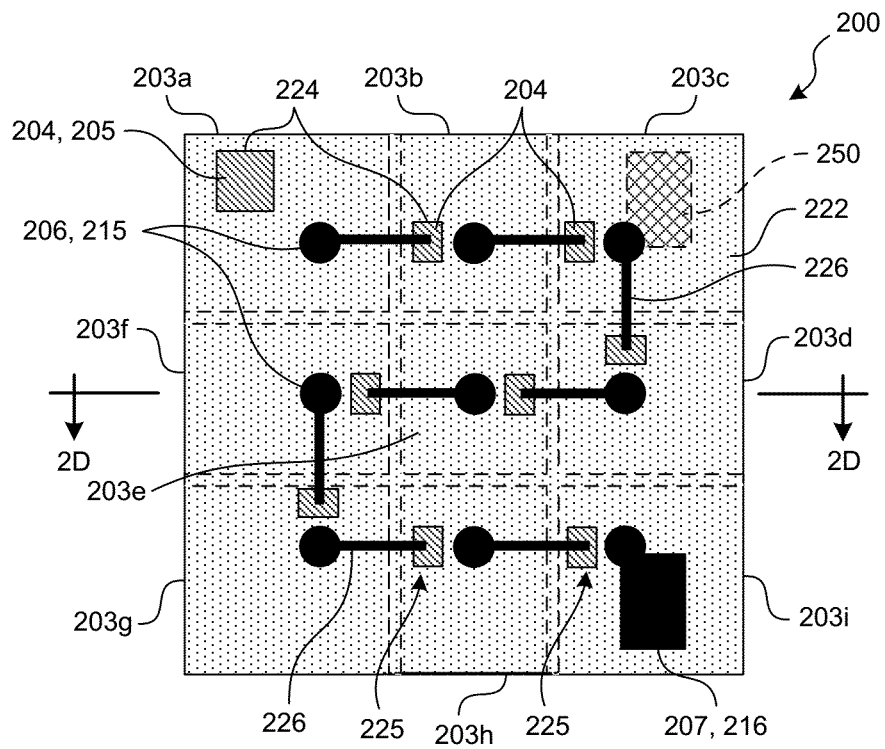
Figure 2D:
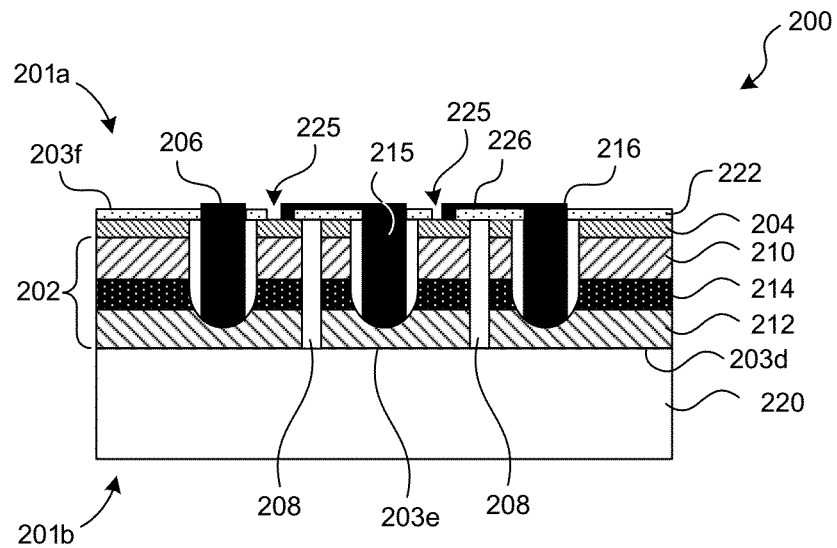

FIGS. 2C and 2D illustrate a stage in the process after a dielectric material 222 (e.g., a passivation material) has been formed over the first contact 204. Among other functions, the dielectric material 222 is used to protect the underlying transducer structure 202 (with certain features shown in broken lines in FIG. 2C for clarity) from the environment and to prevent shorting the first and second contacts 204, 206 to each other. The dielectric material 222 can be the same as or different from the dielectric material 218 in the openings 219. For example, the dielectric material 222 can include silicon nitride (SiN), silicon dioxide ($SiO_2$), polyimide, and/or other suitable insulative materials. As shown in FIG. 2C, the dielectric material 222 can include apertures 224 that expose portions of the first contact 204. In the illustrated embodiment, the dielectric material 222 includes a rectangular aperture 224 associated with each of the individual junctions 203a-203i. In other embodiments, however, the dielectric material 222 can include more or fewer apertures 224 and/or the apertures 224 can have different shapes (e.g., square, circular, irregular, etc.). The dielectric material 222 can be formed using CVD, PVD, patterning, spin coating, and/or other suitable formation methods. The apertures 224 can be formed by selectively depositing or selectively removing portions of the dielectric material 222. In the illustrated embodiment, the dielectric material 222 is positioned to space the exposed first and second contacts 204 and 206 laterally apart from one another, and therefore reduce the likelihood of shorting the contacts to each other during subsequent processing.

As shown in FIGS. 2C and 2D, the dielectric material 222 does not cover the buried contact elements 215. In a particular embodiment, interconnects 225 can electrically couple the second contact 206 on a junction (e.g., junction 203d) to the first contact 204 via the aperture 224 on an adjacent junction (e.g., junction 203e) such that the junctions (e.g., junctions 203d and 203e) are coupled in series. Interconnects 225 can be formed by depositing interconnect lines 226 over the dielectric material 222 between the buried contact elements 215 and the first contact 204 exposed through the apertures 224. The dielectric material 222 underlying the interconnect lines 226 electrically isolates the first contact 204 from the second contact 206. The interconnect lines 226 can be made from a suitable electrically conductive material, including those used for the second contact material 216, such as nickel (Ni), silver (Ag), copper (Cu), aluminum (Al), tungsten (W) and/or other suitable conductive materials, and can be formed using deposition, patterning, and/or other suitable methods known in the art.

As shown in FIG. 2C, the SST die 200 includes a first external terminal 205 which can be positioned on the junction 203a. The first external terminal 205 can be an exposed portion of the first contact 204 accessible through the aperture 224 at the junction 203a. Generally, the first external terminal 205 is associated with a first junction (e.g., junction 203a) of the plurality of serially coupled junctions (e.g., junctions 203a-203i); however, in other embodiments, the first external terminal 205 can be associated with another junction 203b-203i. Similar to the rectangular apertures 224 associated with each of the other individual junctions 203b-203i, the first external terminal 205 can be formed via a rectangular aperture 224 in the dielectric material 222 exposing the portion of first contact 204. In other embodiments, the aperture 224 can have different shapes (e.g., square, circular, irregular, etc.) to expose the first contact 204 to form the first external terminal 205 on the SST die 200.

Likewise, the SST die 200 includes a second external terminal 207 which can be positioned at the junction 203i and/or another junction that is generally at a terminal end of a serially coupled group of junctions 203. The second external terminal 207 can be made from a suitable electrically conductive material, including those used for the second contact material 216, such as nickel (Ni), silver (Ag), copper (Cu), aluminum (Al), tungsten (W) and/or other suitable conductive materials. The second external terminal 207 can be electrically coupled to the second contact 206 and/or the second semiconductor material 212 of the associated junction (e.g., junction 203i). For example, as illustrated in FIG. 2C, the second external terminal 207 can be formed using deposition, patterning, and/or other suitable methods known in the art over the dielectric material 222 and electrically connected to the second contact 206 of the associated junction (e.g., junction 203i).

In operation, the first and second terminals 205, 207 can be directly attached and/or otherwise externally coupled to external devices, components or power sources (e.g., AC or DC power supplies). The individual junctions 203a-203i are configured to emit light and/or other types of electromagnetic radiation in response to an applied electrical voltage. In one example, the SST die 200 can be coupled serially or in parallel with other SST dies in an SST array to achieve high input voltage in the devices incorporating the SST dies 200, thereby improving device performance.

Optionally, and in another embodiment, the SST die 200 can have a third contact or cross-connection contact 250 (shown in dotted lines at junction 203c, for example) electrically coupled to the interconnect 225 or interconnect lines 226 at one or more the intermediate junctions (e.g., junctions 203b-203h). Cross-connection contacts 250 can be used to form cross connections with additional dies coupled in an array, such as an SST array. Cross-connection contacts and cross-connections are described in detail with respect to the solid-state transducers and high voltage SST arrays described in U.S. patent application Ser. No. 13/603,106, which is incorporated herein by reference in its entirety. Accordingly, the cross-connection contact 250 electrically coupled to the interconnects 125 between junctions 203 (e.g., between junctions 203c and 203d) provide the accessible electrical connection within high voltage (e.g., multiple junction) SST dies 200. As such, input voltage provided through terminals 205, 207 may flow through the serially coupled junctions 203 and also between parallel coupled strings (not shown) of SST dies 200 to provide alternative electrical paths for improving light output and higher flux delivery. Accordingly, array assemblies (not shown) which incorporate the SST dies 200 having the cross-connection contacts 250, have provisions to overcome junction failure, providing reduced variation in bias across individually coupled SST dies 200 in the array. Moreover, the array assemblies can remain in use even after a junction failure, providing improved chip performance and reliability, thereby reducing manufacturing costs.

In additional embodiments, the SST die 200 can include multiple cross-connection contacts 250 associated with the multiple interconnects 125 for providing additional cross-connections (not shown) between, for example, parallel-coupled SST dies 200. In such embodiments, array assemblies (not shown) incorporating SST dies 200 having one or more cross-connection contacts 250 can be configured to include a plurality of cross-connections (not shown) electrically coupling interconnects 225 of SST dies 200 between strings of dies coupled in parallel, for example.

In one embodiment, the cross-connection contact 250 is externally accessible at the first side 201a of the SST die 200 and a cross-connection can be formed by wire bonding and/or direct attachment. In other embodiments, the cross-connection contact 250 can be positioned at the first side 201a of the SST die 200 with suitable insulating or dielectric materials intervening between the cross-connection contact 250 and the underlying first semiconductor material 210 and first contact 204. Suitable materials for cross-connection contacts 250 can include titanium (Ti), aluminum (Al), nickel (Ni), silver (Ag), and/or other suitable conductive materials. The cross-connection contact 250 can also be formed using CVD, PVD, ALD or other suitable techniques known in the semiconductor fabrication arts.

Figure 2E:
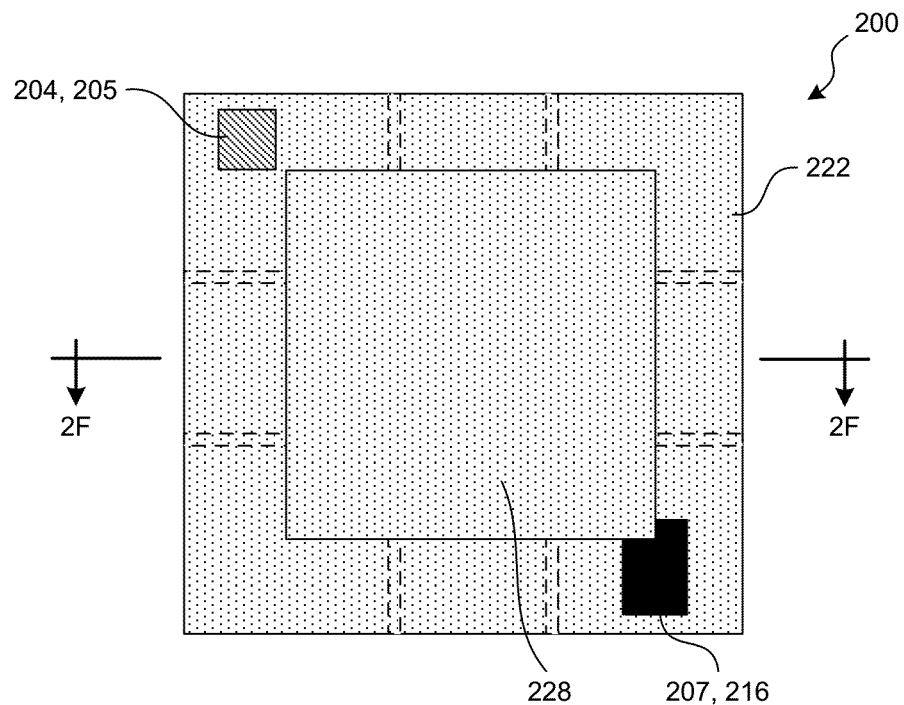
Figure 2F:
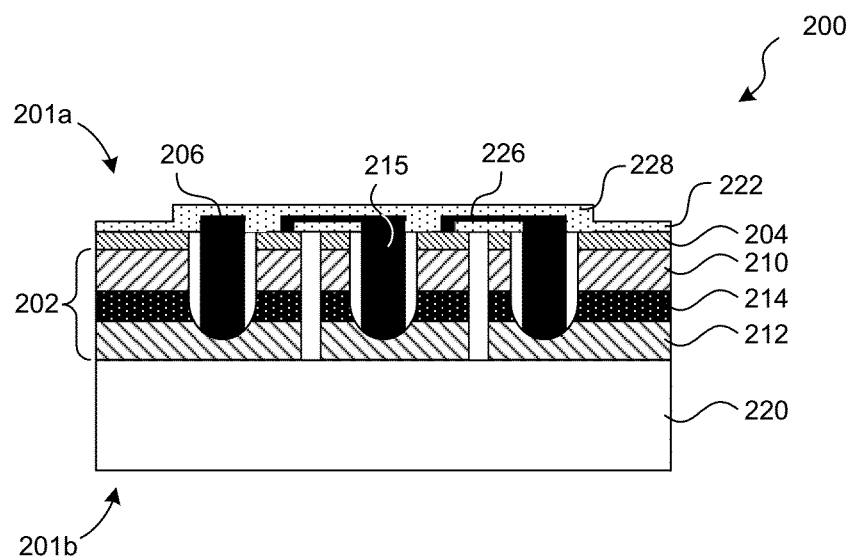

FIGS. 2E-2L illustrate stages in the process during which an additional dielectric portions and conductive material are added to the SST die 200. Certain underlying features of the SST die 200 are shown in broken lines in FIGS. 2E, 2G and 2I for purposes of illustration only. In one embodiment, an additional dielectric portion 228 can be formed of the same material as the dielectric material 222, or can be different material. For example, the additional dielectric portion 228 can comprise silicon nitride, silicon dioxide, polyimide and/or other suitable dielectric materials. As shown in FIGS. 2E and 2F, the additional dielectric portion 228 (e.g., a passivation portion) can be selectively deposited (e.g., via CVD, PVD, or other suitable processes) over portions of the SST die 200 that include the first contacts 204, the second contacts 206, the interconnect lines 226 and the interconnects 225. In some embodiments, the additional dielectric portion 228 can be pre-formed and positioned over the selected electrical contacts and interconnecting portions of the SST die 200. In the illustrated embodiment, the additional dielectric portion 228 is positioned over all of the first contacts 204, the second contacts 206, the interconnect lines 226 and the interconnects 225. Additionally, and as shown in FIG. 2E, the additional dielectric portion 228 is positioned, deposited, patterned and/or otherwise configured so as not to cover the first and second external terminals 205, 207. In other embodiments, the SST dies 200 can include larger or smaller regions of dielectric material and/or portion 222 and 228 that cover larger or smaller portions of the first and second contacts 204 and 206 and the interconnects 225. For example, the dielectric material and/or portion 222 and 228 can be deposited such that one or more second contacts 206 are exposed.

Figure 2G:
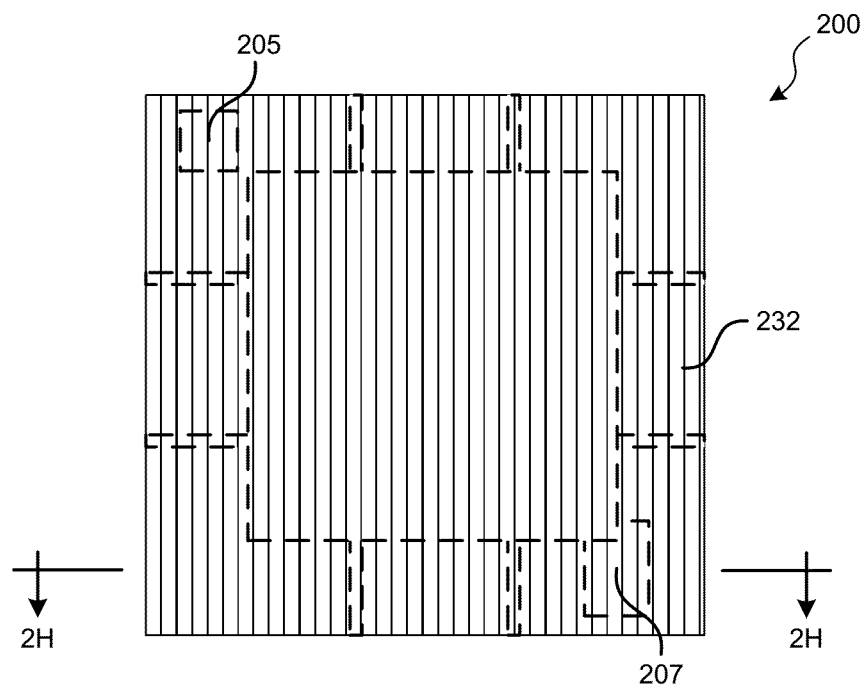
Figure 2H:
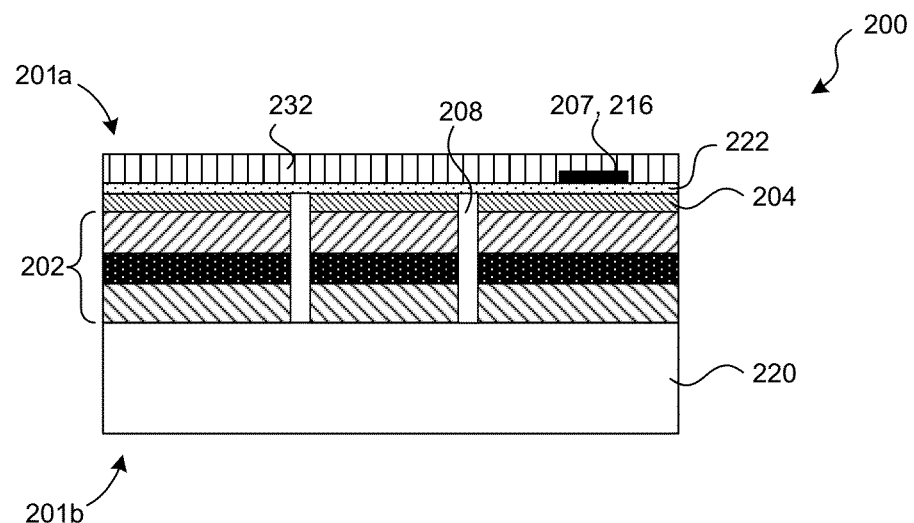

FIGS. 2G and 2H illustrate the addition of barrier material 232, such as a barrier metal, that can be deposited over the dielectric material 222 and/or the additional dielectric portion 228 on the first side 201a of the SST die 200. The barrier material 232 can include cobalt, ruthenium, tantalum, tantalum nitride, indium oxide, tungsten nitride, titanium nitride, tungsten titanium (Wti), and/or other suitable isolative conductive materials, and can be deposited using CVD, PVD, ALD, patterning, and/or other suitable techniques known in the art.

Figure 2I:
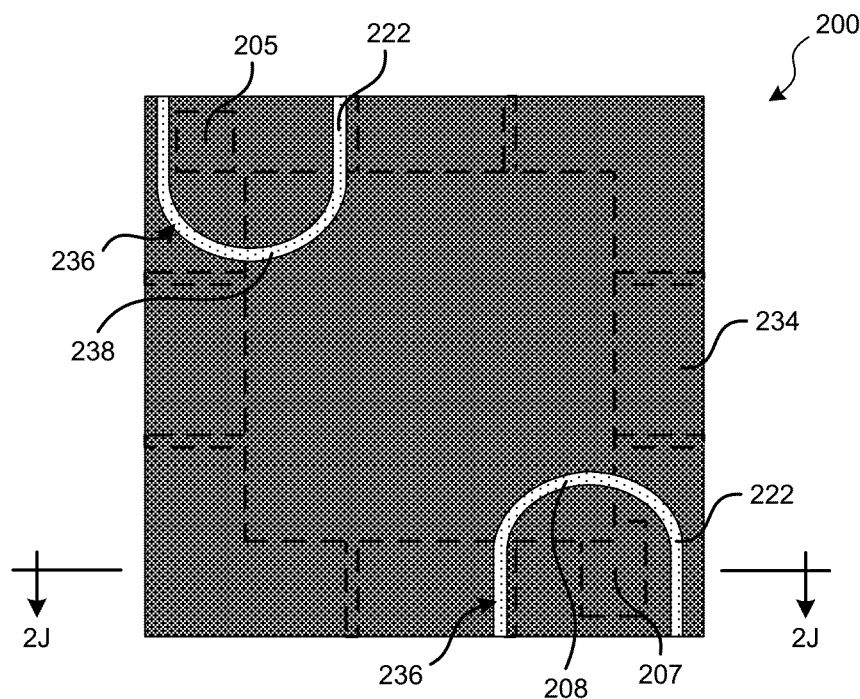
Figure 2J:
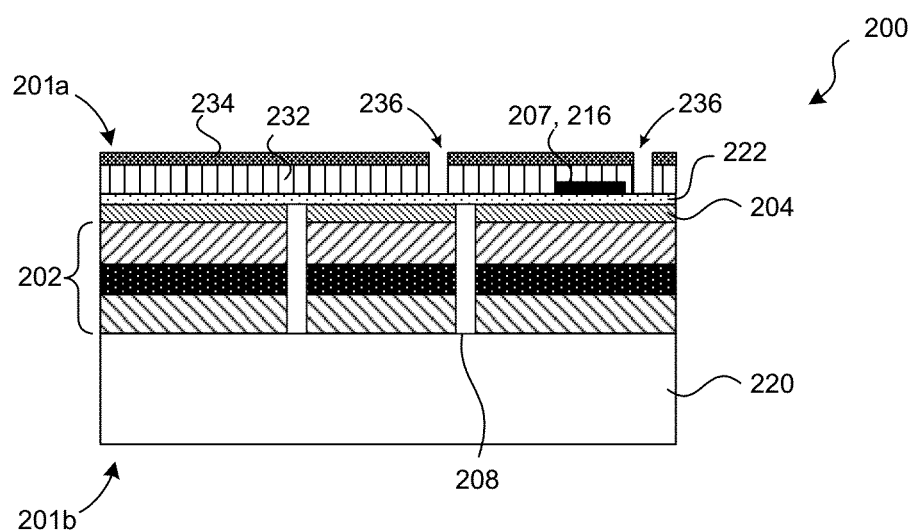

Referring next to FIGS. 2I and 2J, a metallic seed material 234 can be deposited over and adhered to the barrier material 232 on the first side 201a of the SST die 200 to provide, for example, a conductive connection between the underlying transducer structure 202 and other external components. In the illustrated embodiment, the seed material 234 covers the entire first side 201a. In one embodiment, the seed material 234 can include a thin and continuous overlay, or in other arrangements, a non-continuous overlay of Copper (Cu), a titanium/copper alloy, and/or other suitable conductive materials, and can be deposited by electroplating, electroless plating, or other methods. For example, the seed material 234 can be deposited using CVD, PVD, ALD, patterning, sputter-depositing and/or other suitable techniques known in the art.

Referring to FIGS. 2G-2J together, the barrier material 232 prevents the diffusion of the seed material 234 (e.g., Cu seed material) from diffusing into the underlying semiconductor materials, such as the dielectric material 222, the additional dielectric portion 228, or the transducer structure 202, including the first and second semiconductor materials 210, 212 and the active region 214, which could alter the electrical characteristics of the SST die 200.

FIGS. 2I and 2J also illustrate a stage in the process in which the seed material 234 and the barrier material 232 is patterned to expose the underlying dielectric material 222 or the additional dielectric portion 228. As shown in FIG. 2I, the seed material 234 and barrier material 232 can be selectively removed or etched to create a dielectric path 236 on the first side 201a that surrounds and electrically isolates the first external terminal 205 and the second external terminal 207. In another embodiment the barrier material 232 and/or seed material 234 can be selectively deposited over the dielectric material 222 and dielectric portion 228 while leaving those sections forming the dielectric path 236 void of barrier material 232 and/or seed material 234, respectively.

Figure 2K:
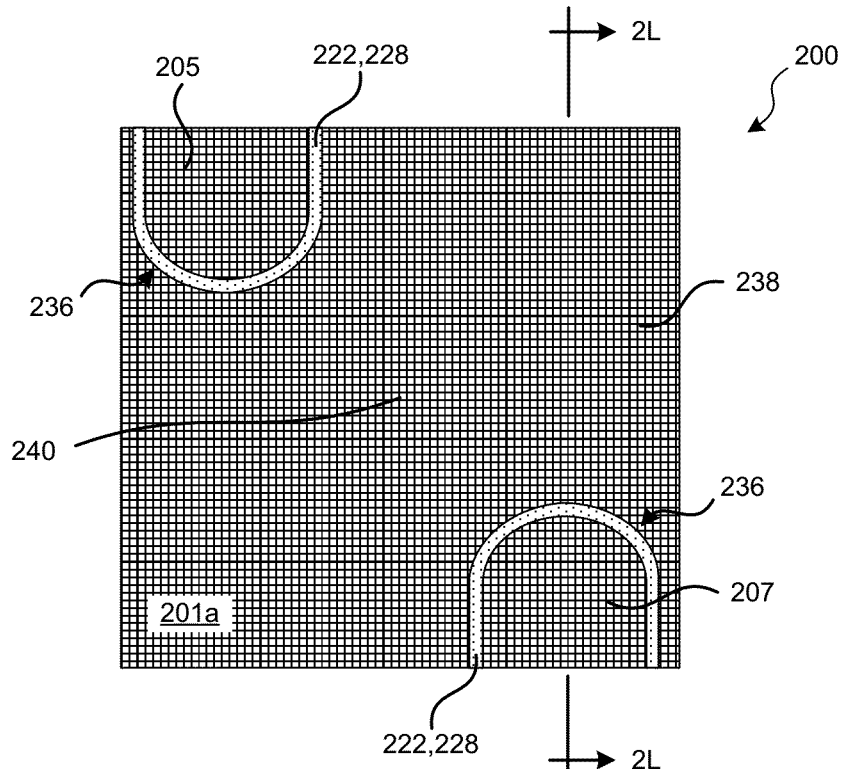
Figure 2L:
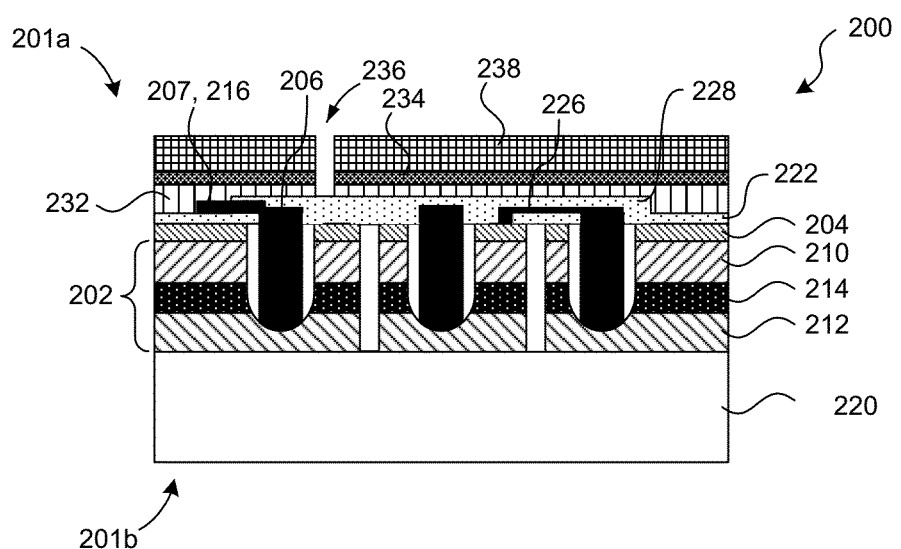

FIGS. 2K and 2L illustrate a stage in the process in which a metal substrate 238 is formed over the seed material 234 on the first side 201a of the SST die 200. In one embodiment, the metal substrate 238 can comprise copper (Cu), aluminum (Al), an alloy (e.g., a NiFe alloy), or other suitable material. The metal substrate can be formed by electroplating, electroless plating, or other technique know in the art. In some embodiments, the metal substrate 238 can have a thickness of approximately 100 μm; however, in other embodiments, the metal substrate 238 can have a variety of thicknesses. As shown in FIGS. 2K and 2L, the metal substrate 238 (e.g., thick copper substrate) can be patterned to expose the underlying dielectric material 222 or the additional dielectric portion 228 along the dielectric path 336. In one embodiment, the metal substrate 238 can be selectively plated such that those sections of the dielectric material 222 and the dielectric portion 228 forming the dielectric path 236 is void of the metal substrate 238. As described, the dielectric path 236 surrounds and electrically isolates the first external terminal 205 and the second external terminal 207. The conductive metal substrate 238 electrically and vertically coupled to the first and second external terminals 205, 207 and surrounded by the dielectric path 236, provides external bonding sites for direct attachment of external components without the need for additional wire bonds or bond pads.

Referring back to FIG. 2K, the metal substrate 238 can be thermally conductive to transfer heat from the SST die 200 to an external heat sink (not shown) and provide the SST die 200 with a thermal pad 240 on the first side 201a. For example, the metal substrate 238 can comprise copper, aluminum or an alloy that has a coefficient of thermal expansion at least generally similar to the coefficient of thermal expansion of the SST die 200 or to that of a larger package or circuit board that the SST die 200 is associated. Accordingly, the thermal pad 240 can decrease the operating temperature of the SST die 200 by transferring heat to a board, a package, a heat sink, or another element of a device that includes the SST die 200. Additionally, although the illustrated embodiment of FIG. 2K includes only one thermal pad 240, in other embodiments, the SST die 200 may include a plurality of smaller and/or separate thermal pads 240 having any of a variety of suitable sizes and shapes and located at any of a variety of suitable positions on the first side 201a of the SST die 200.

Figure 3A:
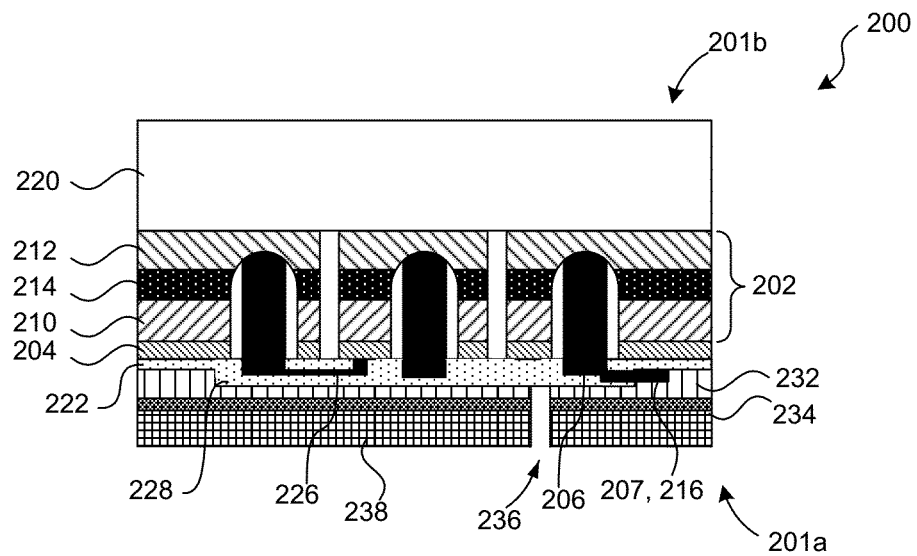
FIGS. 3A and 3B are cross-sectional views illustrating further portions of a process for forming solid-state transducers in accordance with further embodiments of the present technology.
Figure 3B:
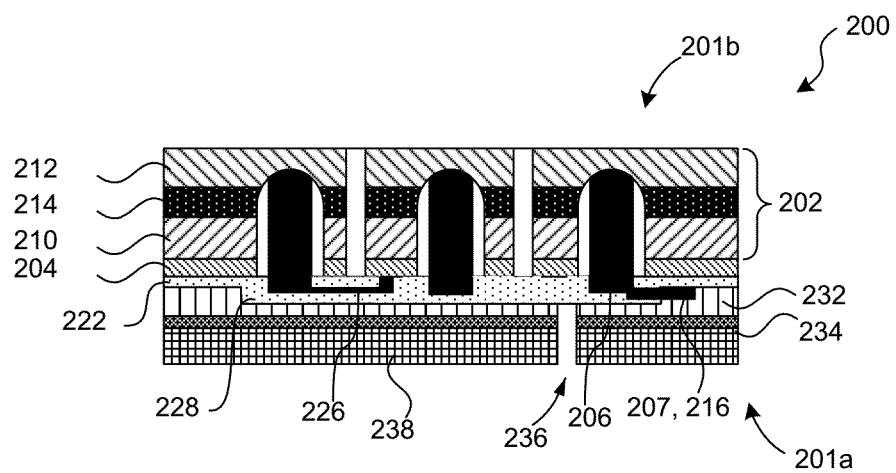

The SST die 200 (FIG. 2L) can be attached to another carrier substrate (not shown) or otherwise inverted and the metal substrate 238 can provide a support for further processing on the second side 201b of the SST die 200. FIGS. 3A-3B are schematic cross-sectional views of the SST die 200 of FIG. 2L in various stages of further processing. For example, FIGS. 3A and 3B illustrate a step in the process where the SST die 200 has been inverted, and the growth substrate 220 has been removed (FIG. 4B), such that the transducer structure 202 is exposed at the second side 201b of the SST die 200. The growth substrate 220 can be removed by chemical-mechanical planarization (CMP), backgrinding, etching (e.g., wet etching, dry etching, etc.), chemical or mechanical lift-off, and/or other removal techniques. The process can also include roughening of the second semiconductor material 212 (not shown). Similarly, the metal substrate 138 can be ground or thinned, if desired, by backgrinding, CMP, etching, and/or other suitable methods (not shown). In further embodiments not shown, the SST die 200 can undergo additional processing to enhance or improve (e.g., optimize) optical properties, and/or other properties. For example, optical elements, such as lenses, can be added to second side 201b of the SST die 200. The resulting SST die 200 includes the first external terminal 205 (shown in FIG. 2K), a second external terminal 207, and the thermal pad 240 (shown in FIG. 2K) at the first side 201a and that can be mounted on a board, a package or another component without requiring wire bonds e.g., using a solder reflow process. Accordingly, the direct attach terminals 205, 207 and thermal pad 240 allow the SST die 200 to be efficiently mounted to a board or other substrate or support in a single step process.

Figure 4A:
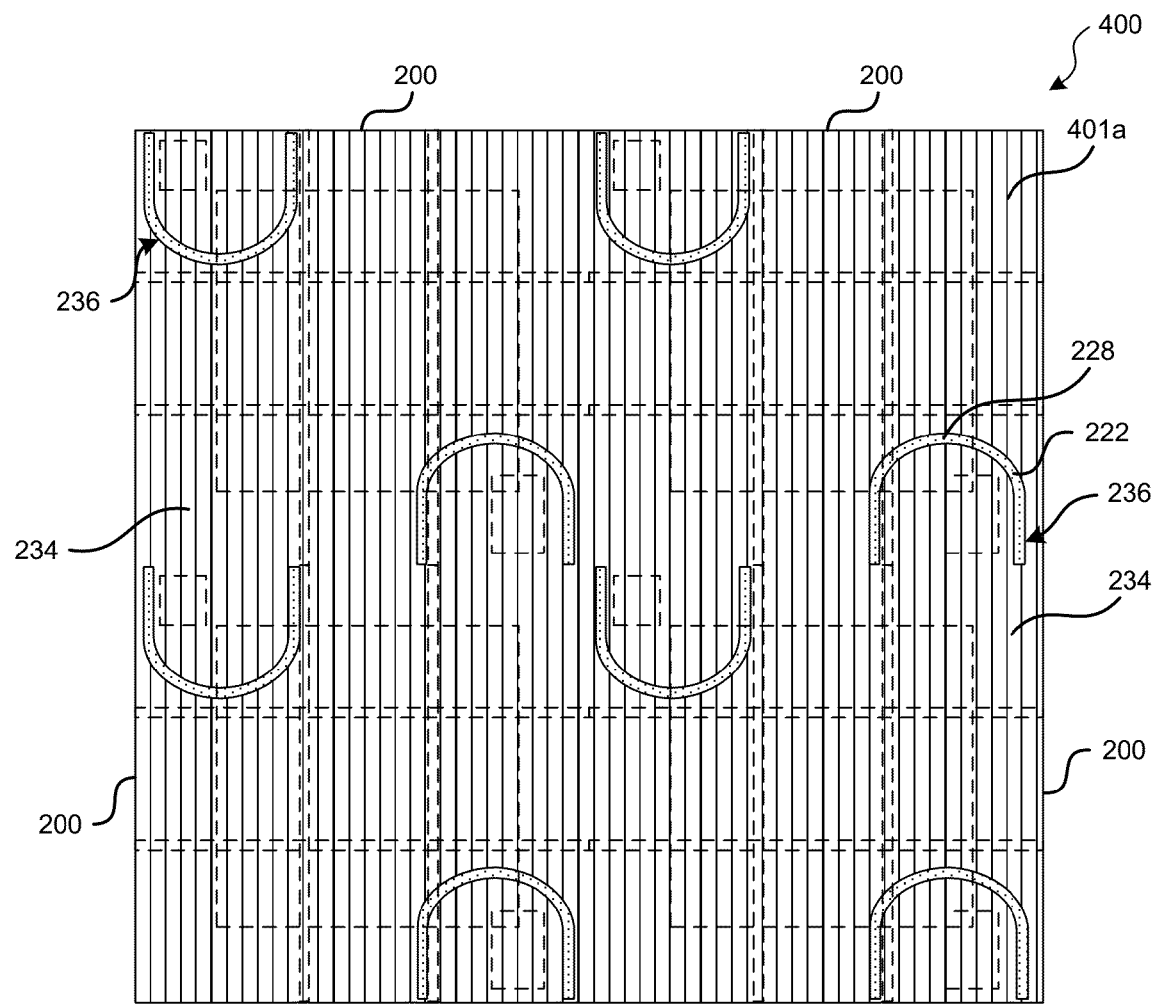
FIGS. 4A-4C are schematic plan views illustrating portions of a process for forming a wafer level assembly having a plurality of solid-state transducers configured in accordance with another embodiment of the present technology.
Figure 4B:
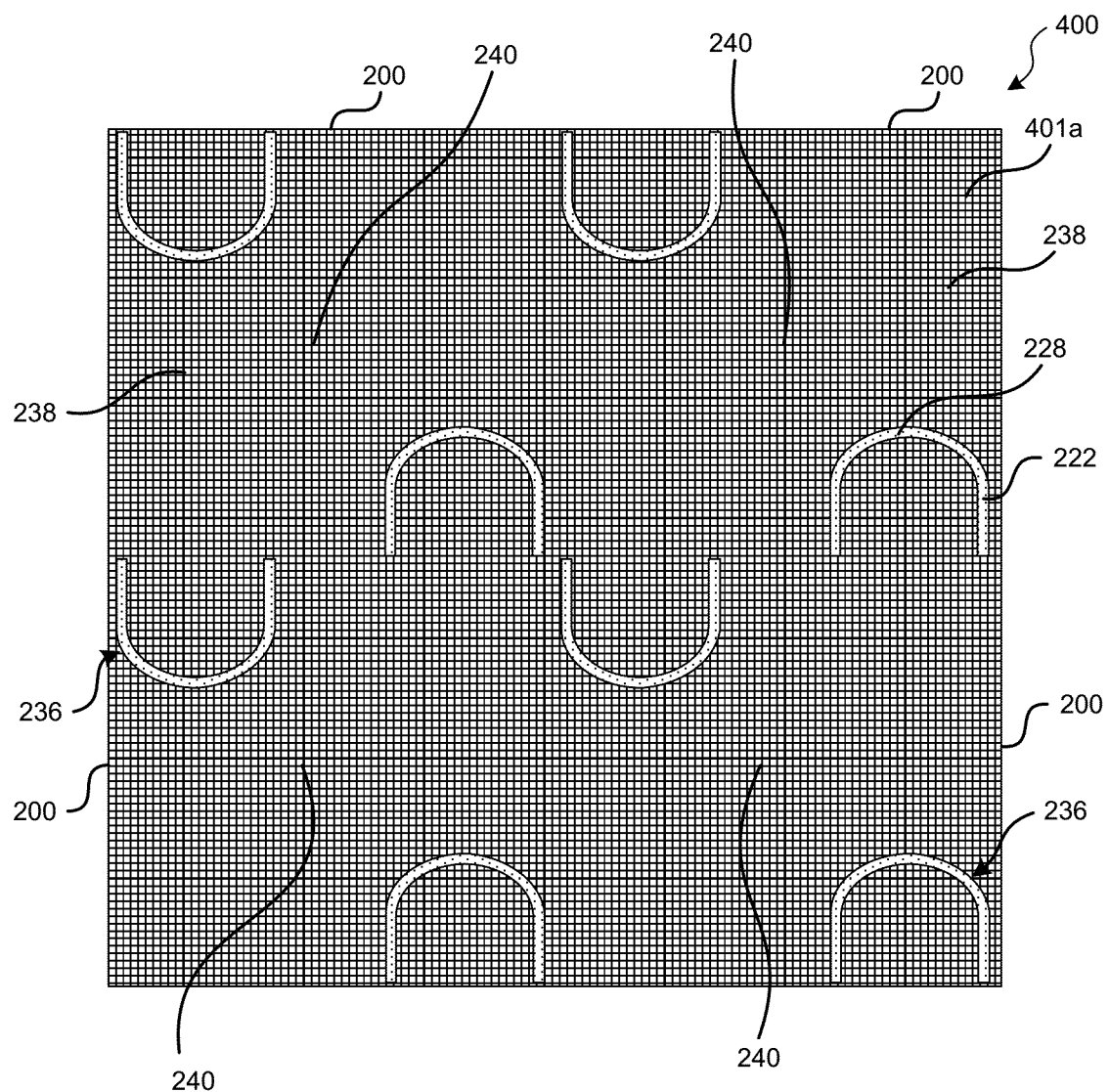
Figure 4C:
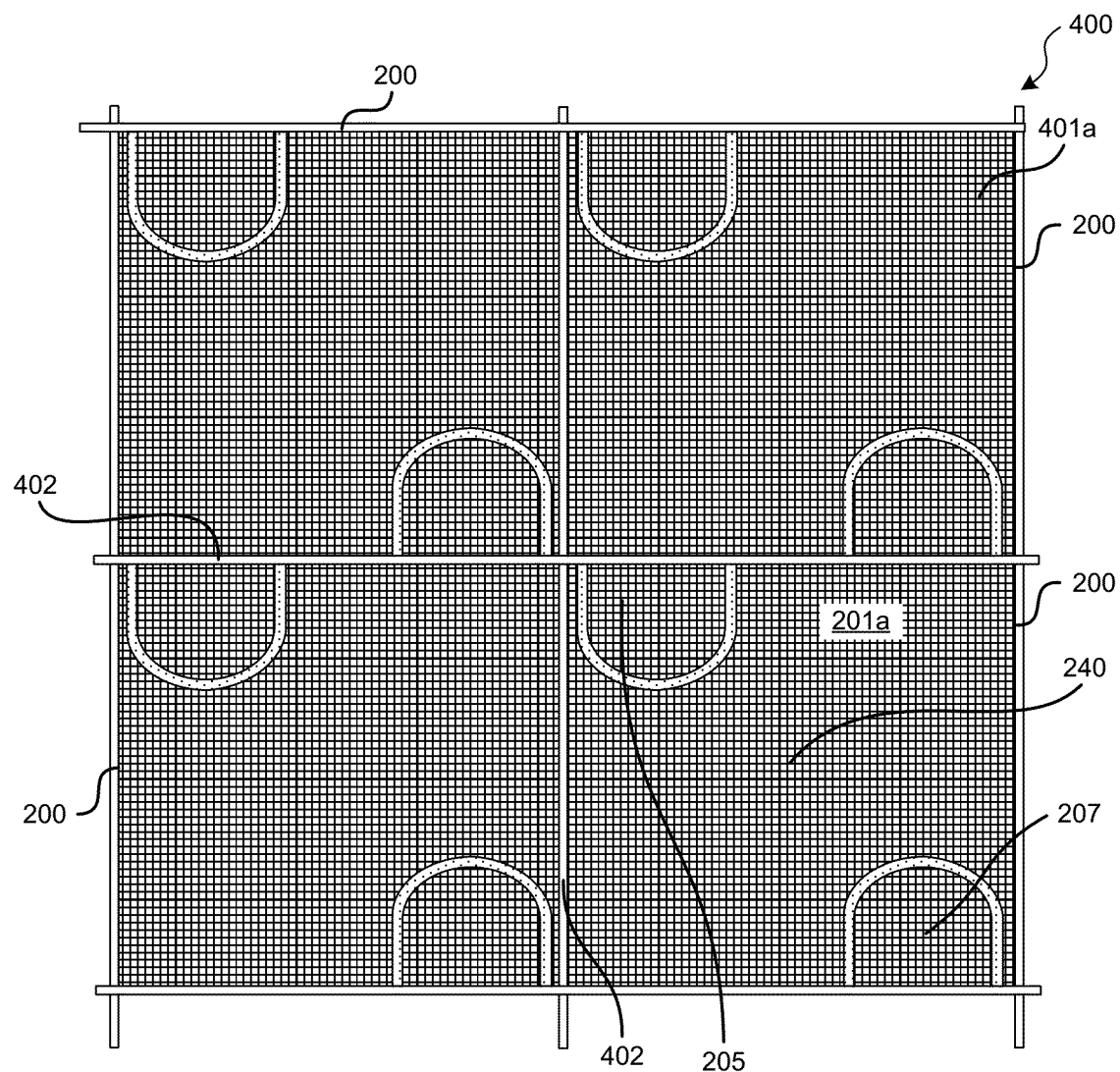

For illustrative purposes, FIGS. 2A-3B show stages of a fabrication process on an individual SST die 200. FIGS. 4A-4C show portions of wafer-level assemblies having a plurality of SST dies 200. A person skilled in the art will recognize that each stage of the processes described herein can be performed at the wafer level or at the die level. FIG. 4A is a plan view of a portion of a wafer level assembly 400 having a first side 401a and including four individual SST dies 200 generally similar to that shown in FIG. 2I. Accordingly, FIG. 4A illustrates a stage in the process of fabrication in which the metallic seed material 234 is deposited over and adhered to the underlying barrier material 232 (shown in FIGS. 2G, 2H and 2J, for example) on the first side 401a of the wafer level assembly 400 to provide, for example, a conductive connection between the underlying transducer structures 202 (shown in FIG. 2J) and other external components. As shown in FIG. 4A, the seed material 234 and the barrier material 232 (shown in FIG. 2J) are patterned to expose the underlying dielectric material 222 or the additional dielectric portion 228 and create a plurality of dielectric paths 236.

FIG. 4B is a plan view of the portion of the wafer level assembly 400 at a stage in the process generally similar to that shown in FIG. 2K. For example, FIG. 4B illustrates a stage in the process of fabrication in which the metal substrate 238 is formed over the seed material 234 on the first side 401a of the wafer level assembly 400 and patterned to form the plurality of dielectric paths 236. Each of the individual SST dies 200 includes a thermal pad 240. As shown in FIG. 4C, the assembly 400 can be diced along dicing lanes 402 to form singulated SST dies 200, or in another embodiment, can be processed to form an SST array. The singulated SST dies 200 include the first external terminal 205, the second external terminal 207 and the thermal pad 240 at the first side 201a, 401a.

From the foregoing, it will be appreciated that specific embodiments of the technology have been described herein for purposes of illustration, but that various modifications may be made without deviating from the disclosure. The SST dies 200 and the assembly 400 can include additional components, and/or different combinations of the components described herein. For example, the SST dies 200 and/or the assembly 400 can be incorporated into SST arrays having multiple dies or assemblies. Further, optical elements, such as lenses can be added to each of the individual SST dies 200. Furthermore, the assembly 400 includes a 2×2 array of SST dies 200, however, in other embodiments, assemblies can include different numbers of SST dies and/or have different shapes (e.g., rectangular, circular, etc.). Additionally, certain aspects of the present technology described in the context of particular embodiments may be eliminated in other embodiments. For example, the configuration of the dielectric material 222 and the dielectric portion 228 can be altered to expose or cover differing combinations of contacts, interconnects and/or other conductive lines. Additionally, while features associated with certain embodiments of the present technology have been described in the context of those embodiments, other embodiments may also exhibit such features, and not all embodiments need necessarily exhibit such features to fall within the scope of the technology. Accordingly, the disclosure and associated technology can encompass other embodiments not expressly shown or described herein.

We claim:

1. A solid state transducer (SST) wafer, comprising:
    a transducer structure having a first semiconductor material at a first side, a second semiconductor material at a second side opposite the first side, and a light-emitting active region between the first semiconductor material and the second semiconductor material; and
    a plurality of features that separate the transducer structure into a plurality of individually addressable light-emitting diode (LED) dies, wherein each LED die includes—
        a first electrical terminal coupled to the first semiconductor material at the first side;
        a second electrical terminal coupled to the second semiconductor material at the first side;
        a plurality of junctions coupled in series between the first electrical terminal and the second electrical terminal;
        a plurality of internal first contacts;
        a plurality of internal second contacts;
        a plurality of interconnections between one or more internal first and second contacts; and
        a thermal pad disposed on the first side.

2. The SST wafer of claim 1, further comprising a third contact coupled to the interconnection, the third contact configured to cross-connect to another contact on a second die.

3. The SST wafer of claim 1, further comprising a conductive material over the internal first contacts, the internal second contacts and the interconnections.

4. The SST wafer of claim 3, further comprising a barrier material between the conductive material and the internal first contacts, the internal second contacts and the interconnections.

5. A solid state transducer (SST) die, comprising:
a first terminal on a first side of the SST die;
a second terminal on the first side of the SST die;
a plurality of SST junctions coupled in series between the first and second terminals;
a plurality of buried first contacts, wherein each individual SST junction includes at least one buried first contact;
a plurality of buried second contacts, wherein each individual SST junction includes at least one buried second contact;
a plurality of buried interconnects between each individual junction, wherein each buried interconnect couples at least one buried second contact to at least one buried first contact on an adjacent junction; and
a thermal pad on the first side of the SST die.

6. The SST die of claim 5 wherein the buried first and second contacts and the buried interconnects are buried under a barrier material and a conductive metal.

7. The SST die of claim 6 wherein the conductive metal is copper.

8. The SST die of claim 5 wherein the first terminal and the second terminal are electrically isolated by a plurality of dielectric paths.

* * * * *